United States Patent
Han et al.

(10) Patent No.: US 10,290,688 B2
(45) Date of Patent: May 14, 2019

(54) AMOLED DEVICE AND MANUFACTURING METHOD THEREOF

(71) Applicant: Shenzhen China Star Optoelectronics Technology Co., Ltd., Shenzhen (CN)

(72) Inventors: Baixiang Han, Shenzhen (CN); Yuanchun Wu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 84 days.

(21) Appl. No.: 15/328,490

(22) PCT Filed: Dec. 16, 2016

(86) PCT No.: PCT/CN2016/110242
§ 371 (c)(1),
(2) Date: Jan. 24, 2017

(87) PCT Pub. No.: WO2018/045657
PCT Pub. Date: Mar. 15, 2018

(65) Prior Publication Data
US 2018/0219054 A1     Aug. 2, 2018

(30) Foreign Application Priority Data
Sep. 9, 2016  (CN) .......................... 2016 1 0814345

(51) Int. Cl.
*H01L 27/32*      (2006.01)
*H01L 51/00*      (2006.01)
(Continued)

(52) U.S. Cl.
CPC ...... *H01L 27/3248* (2013.01); *H01L 27/1214* (2013.01); *H01L 27/32* (2013.01);
(Continued)

(58) Field of Classification Search
CPC ............. H01L 27/3248; H01L 51/5206; H01L 27/3272; H01L 51/0022; H01L 51/56;
(Continued)

(56) References Cited

U.S. PATENT DOCUMENTS

2016/0036005 A1* 2/2016 Qi ...................... H01L 51/5206
257/40
2017/0194405 A1* 7/2017 Tang ................... H01L 27/3262

FOREIGN PATENT DOCUMENTS

CN        1692679 A      11/2005
CN        101916831 A    12/2010
(Continued)

*Primary Examiner* — Tom Thomas
*Assistant Examiner* — Benjamin T Liu
(74) *Attorney, Agent, or Firm* — Leong C. Lei

(57) ABSTRACT

The present invention provides an AMOLED device and a manufacturing method thereof. The manufacturing method of the AMOLED device according to the present invention adopts an ink jet printing operation to form an anode of the AMOLED device and thus, compared to the prior art operations, saves one mask and reduces one round of photoengraving thereby simplifying the manufacturing operation of the AMOLED device and lowering the manufacturing costs. The AMOLED device according to the present invention comprises an anode that is formed through an ink jet printing operation, so that the manufacturing operation is simplified and the manufacturing cost is reduced.

8 Claims, 6 Drawing Sheets

(51) Int. Cl.
  *H01L 51/52*  (2006.01)
  *H01L 51/56*  (2006.01)
  *H01L 51/50*  (2006.01)
  *H01L 27/12*  (2006.01)

(52) U.S. Cl.
  CPC ...... *H01L 27/3262* (2013.01); *H01L 27/3272* (2013.01); *H01L 51/0022* (2013.01); *H01L 51/50* (2013.01); *H01L 51/5206* (2013.01); *H01L 51/56* (2013.01); *H01L 2227/323* (2013.01); *H01L 2251/301* (2013.01)

(58) Field of Classification Search
  CPC ........... H01L 27/3262; H01L 2251/301; H01L 2227/323; H01L 51/50; H01L 27/12; H01L 27/32
  See application file for complete search history.

(56) References Cited

FOREIGN PATENT DOCUMENTS

| | | |
|---|---|---|
| CN | 103700685 A | 4/2014 |
| CN | 104465788 A | 3/2015 |

\* cited by examiner

AMOLED DEVICE AND MANUFACTURING METHOD THEREOF

BACKGROUND OF THE INVENTION

1. Field of the Invention

The present invention relates to the field of display technology, and more particular to an active matrix organic light-emitting diode (AMOLED) device and a manufacturing method thereof.

2. The Related Arts

Organic light-emitting diode (OLED) displays, which are also referred to organic electroluminescent displays, are a newly emerging flat panel display device and possess advantages, such as being self-luminous, low drive voltage, high luminous brightness, short response time, high clarity and contrast, almost 180° view angle, wide range of operation temperature, and easy realization of flexible displaying and large-area full-color displaying, and are considered the most promising display devices.

Based on the way of driving, OLEDs can be classified in two categories, passive matrix OLED (PMOLED) and active matrix OLED (AMOLED), namely one for direct addressing, and the other for TFT array addressing, among which, the AMOLED comprises pixels that are arranged in an array and belongs to an active display type, having high light emission performance and being commonly used in high definition large-sized display devices.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) pixel electrode and a metal electrode to respectively serve as the anode and cathode of the device and electrons and holes, when driven by a predetermined electrical voltage, are respectively injected into the electron transport layer and the hole transport layer such that the electrons and the holes respectively migrate through the electron transport layer and the hole transport layer to get into the emissive layer and meet in the emissive layer to form excitons that excites light emissive molecules to emit light, the later undergoing radiation relaxation to give off visible light.

FIG. 1 is a schematic view illustrating the structure of a conventional AMOLED device. As shown in FIG. 1, the AMOLED device comprises a backing plate 100, a gate electrode 200 disposed on the backing plate 100, a gate insulation layer 300 disposed on the gate electrode 200 and the backing plate 100, an active layer 400 disposed on the gate insulation layer 300, an etch stop layer 500 disposed on the active layer 400 and the gate insulation layer 300, source/drain electrodes 600 disposed on the etch stop layer 500, a planarization layer 700 disposed on the source/drain electrodes 600 and the etch stop layer 500, an anode 800 disposed in a via 710 formed in the planarization layer 700, an emissive layer (not shown) disposed on the anode 800, and a cathode (not shown) disposed on the emissive layer. In the AMOLED device, structural layers, including the gate electrode 200, the active layer 400, the etch stop layer 500, the source/drain electrodes 600, the planarization layer 700, and the anode 800, are each realized through a round of deposition operation or coating operation applied in combination with a mask based manufacturing process. Thus, the number of the masks used is large and the manufacturing process is complicated, leading to extension of production time of the AMOLED device and low manufacturing cost. Therefore, further improvement is necessary.

SUMMARY OF THE INVENTION

Objectives of the present invention are to provide a manufacturing method of an active matrix organic light-emitting diode (AMOLED) device, which uses an ink jet printing process to form an anode of the AMOLED device so as to simplify the manufacturing operation of the AMOLED device and reduce the manufacturing cost.

Objectives of the present invention are also to provide an AMOLED device, of which an anode is formed through an ink jet printing process so that the manufacturing operation is simple and the manufacturing cost is low.

To achieve the above objective, the present invention provides a manufacturing method of an AMOLED device, which comprises the following steps:

Step 1: providing a thin-film transistor (TFT) substrate, wherein the TFT substrate comprises a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, and a first via formed in the planarization layer and located above and corresponding to the drain electrode such that the first via exposes at least a portion of the drain electrode;

Step 2: applying an ink jet printing operation to form an anode in the first via of the planarization layer of the TFT substrate such that the anode is in contact engagement with the drain electrode; and Step 3: forming an emissive layer on the anode and forming a cathode on the emissive layer and the planarization layer.

The ink jet printing operation applied in Step 2 uses a printing substance that comprises an aqueous solution containing nanometer metal particles dispersed therein; and the nanometer metal particles comprise at least one of nanometer silver particle, nanometer gold particle, and nanometer copper particle.

The first via has an inner wall surface that exhibits hydrophilic property, and the portion of the drain electrode that is exposed through the first via has a surface that exhibits hydrophilic property; and the planarization layer has a portion around a circumference of the first via and having a surface exhibiting hydrophobic property.

In Step 1, the planarization layer is further provided with a second via formed therein and the second via is arranged to be located above and corresponding to the active layer so as to expose a portion of the etch stop layer; and Step 2 further comprises: applying an ink jet printing operation to form a conductive layer in the second via of the planarization layer of the TFT substrate at the same time of formation of the anode; the conductive layer being a channel shielding layer or a top gate electrode.

The second via has an inner wall surface that exhibits hydrophilic property and the portion of the etch stop layer that is exposed through the second via has a surface that exhibits hydrophilic property; the planarization layer has a portion around a circumference of the second via and having a surface exhibiting hydrophobic property.

The present invention also provides an AMOLED device, which comprises: a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, a first via formed in the planarization layer and located above and corresponding to the drain electrode, an anode arranged on the first via and in contact engagement with the drain electrode, an emissive layer arranged on the anode, and a cathode arranged on the emissive layer 70 and the planarization layer;

wherein the anode is formed by applying an ink jet printing operation and the anode comprises a material that comprises nanometer metal particles.

The anode is formed through ink jet printing of an aqueous solution containing nanometer metal particles dispersed therein; and the nanometer metal particles comprise at least one of nanometer silver particle, nanometer gold particle, and nanometer copper particle.

The first via has an inner wall surface that exhibits hydrophilic property, and a portion of the drain electrode that is exposed through the first via has a surface that exhibits hydrophilic property; the planarization layer has a portion around a circumference of the first via and having a surface exhibiting hydrophobic property.

The planarization layer is further provided with a second via, and the second via is arranged to be located above and corresponding to the active layer so as to expose a portion of the etch stop layer; the second via receives a conductive layer arranged therein and the conductive layer and the anode are formed in the same process with the same material; and the conductive layer is a channel shielding layer or a top gate electrode.

The second via has an inner wall surface that exhibits hydrophilic property and the portion of the etch stop layer that is exposed through the second via has a surface that exhibits hydrophilic property; the planarization layer has a portion around a circumference of the second via and having a surface exhibiting hydrophobic property.

The present invention further provides an AMOLED device, which comprises: a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, a first via formed in the planarization layer and located above and corresponding to the drain electrode, an anode arranged on the first via and in contact engagement with the drain electrode, an emissive layer arranged on the anode, and a cathode arranged on the emissive layer and the planarization layer;

wherein the anode is formed by applying an ink jet printing operation and the anode comprises a material that comprises nanometer metal particles;

wherein the anode is formed through ink jet printing of an aqueous solution containing nanometer metal particles dispersed therein; and the nanometer metal particles comprise at least one of nanometer silver particle, nanometer gold particle, and nanometer copper particle;

wherein the first via has an inner wall surface that exhibits hydrophilic property, and a portion of the drain electrode that is exposed through the first via has a surface that exhibits hydrophilic property; the planarization layer has a portion around a circumference of the first via and having a surface exhibiting hydrophobic property; and wherein the planarization layer is further provided with a second via, and the second via is arranged to be located above and corresponding to the active layer so as to expose a portion of the etch stop layer; the second via receives a conductive layer arranged therein and the conductive layer and the anode are formed in the same process with the same material; and the conductive layer is a channel shielding layer or a top gate electrode.

The efficacy of the present invention is that the present invention provides an AMOLED device and a manufacturing method thereof. The manufacturing method of the AMOLED device according to the present invention adopts an ink jet printing operation to form an anode of the AMOLED device and thus, compared to the prior art operations, saves one mask and reduces one round of photoengraving thereby simplifying the manufacturing operation of the AMOLED device and lowering the manufacturing costs. The AMOLED device according to the present invention comprises an anode that is formed through an ink jet printing operation, so that the manufacturing operation is simplified and the manufacturing cost is reduced.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
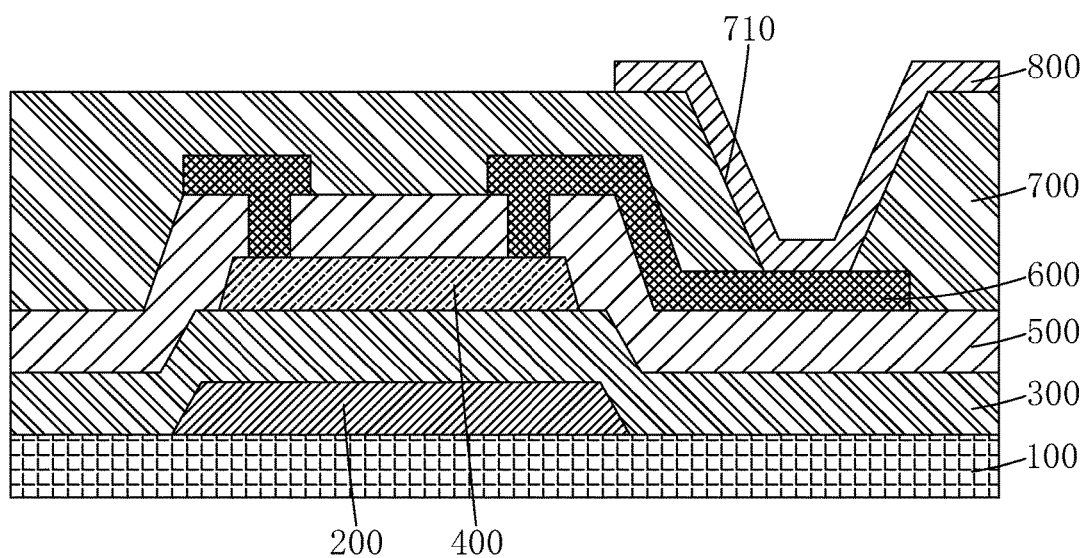
FIG. 1 is a schematic view illustrating the structure of a conventional active matrix organic light-emitting diode (AMOLED) device.
Figure 2:
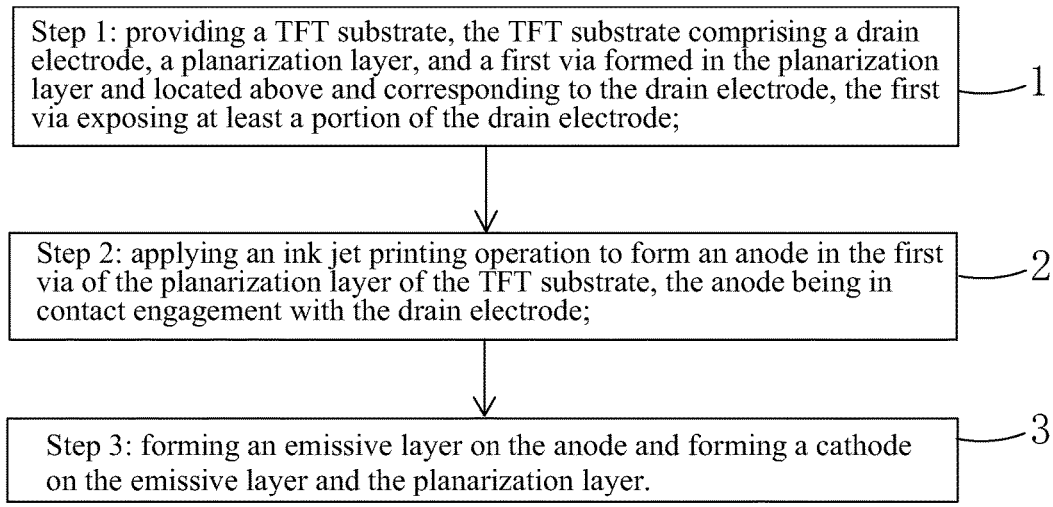
FIG. 2 is a flow chart illustrating a manufacturing method of an AMOLED device according to the present invention.
Figure 3:
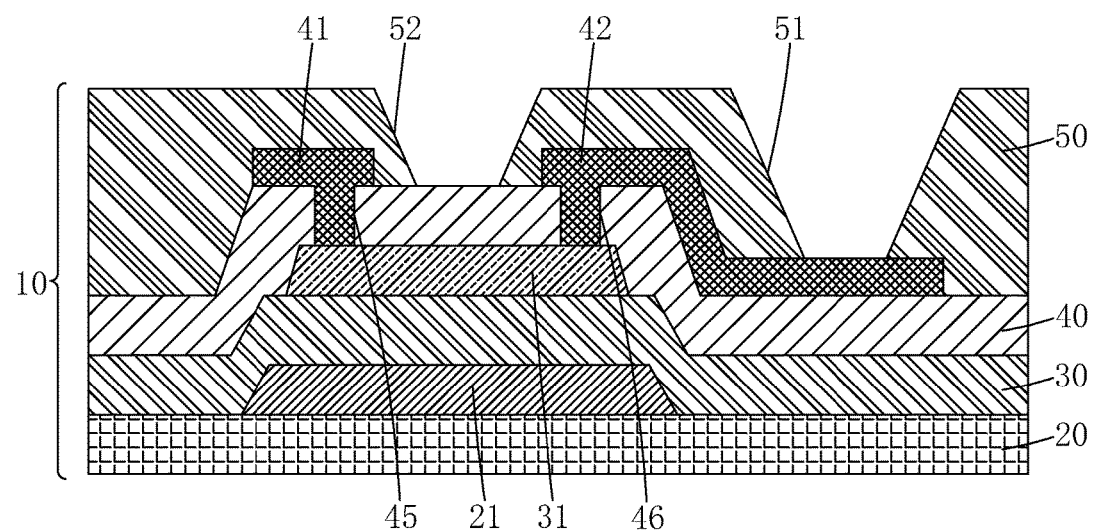
FIG. 3 is a schematic view illustrating Step 1 of the manufacturing method of the AMOLED device according to the present invention.

Referring to FIG. 2, firstly, the present invention provides a manufacturing method of an active matrix organic light-emitting diode (AMOLED) device, which comprises the following steps:

Step 1: as shown in FIG. 3, providing a thin-film transistor (TFT) substrate 10, wherein the TFT substrate 10 comprises a backing 20, a gate electrode 21 arranged on the backing 20, a gate insulation layer 30 arranged on the gate electrode 21 and the backing 20, an active layer 31 arranged on the gate insulation layer 30 and located above and corresponding to the gate electrode 21, an etch stop layer 40 arranged on the active layer 31 and the gate insulation layer 30, a source electrode 41 and a drain electrode 42 arranged on the etch stop layer 40, a planarization layer 50 arranged on the source electrode 41, the drain electrode 42, and the etch stop layer 40, and a first via 51 formed in the planarization layer 50 and located above and corresponding to the drain electrode 42 such that the first via 51 exposes at least a portion of the drain electrode 42.

Preferably, the first via 51 has an inner wall surface that exhibits hydrophilic property, and the portion of the drain electrode 42 that is exposed through the first via 51 has a surface that exhibits hydrophilic property; the planarization layer 50 has a portion around a circumference of the first via 51 and having a surface exhibiting hydrophobic property, so as to help, in a subsequent operation that conducts ink jet printing of an aqueous or water-based printing substance in the first via 51, converge the printing substance in the first via 51.

Specifically, the planarization layer 50 may further be provided with a second via 52 formed therein, and the second via 52 is arranged to be located above and corresponding to the active layer 31 so as to expose a portion of the etch stop layer 40.

Preferably, the second via 52 has an inner wall surface that exhibits hydrophilic property and the portion of the etch stop layer 40 that is exposed through the second via 52 has a surface that exhibits hydrophilic property; the planarization layer 50 has a portion around a circumference of the second via 52 and having a surface exhibiting hydrophobic property, so as to help, in a subsequent operation that conducts ink jet printing of an aqueous or water-based printing substance in the second via 52, converge the printing substance in the second via 52.

Preferably, the planarization layer 50 demonstrates hydrophobic property on a surface of an entire area thereof except the first via 51 and the second via 52.

Specifically, the hydrophilic and hydrophobic property of the surface of each associated structural layer can be achieved with proper treatment or may alternatively be achieved through proper selection of materials of each structure.

Specifically, the etch stop layer 40 is provided with a third via 45 and a fourth via 46 formed therein to respectively correspond to two opposite ends of the active layer 31 and the source electrode 41 and the drain electrode 42 are respectively set in contact engagement with the active layer 31 through the third via 45 and the fourth via 46.

Figure 4:
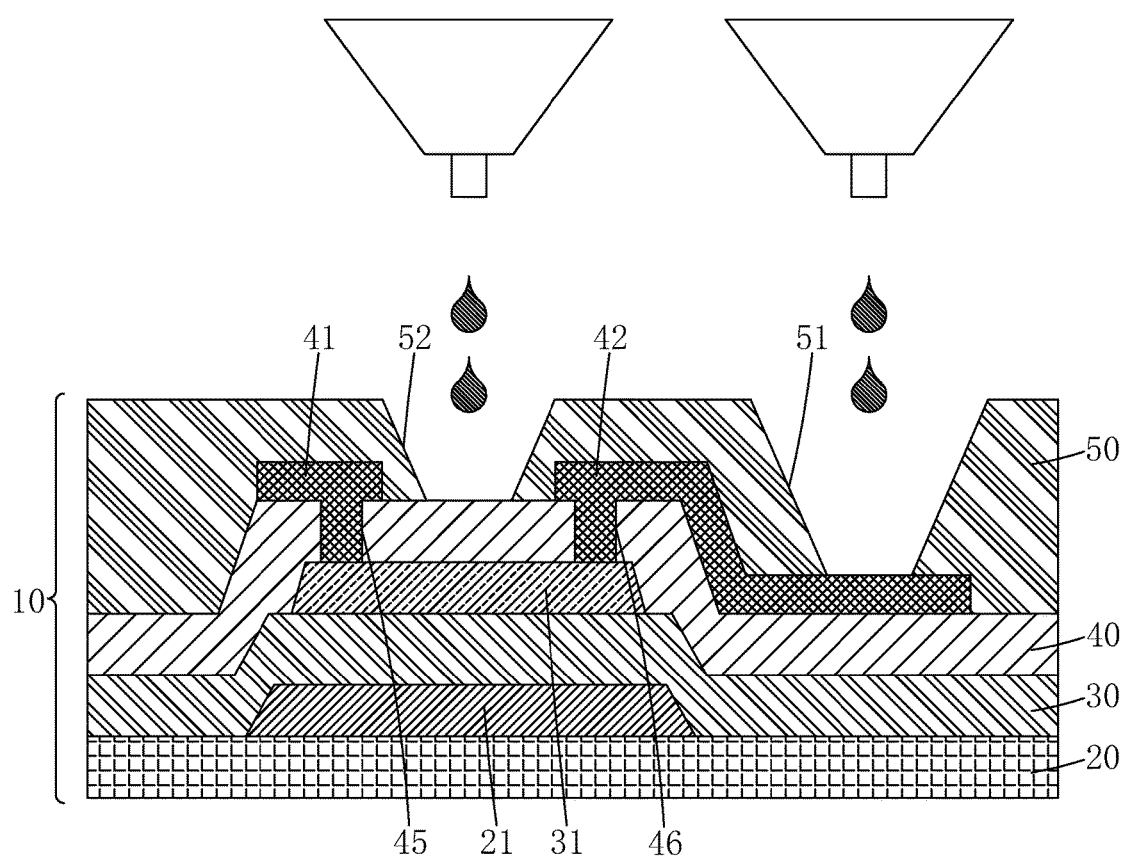
FIGS. 4 and 5 are schematic views illustrating Step 2 of the manufacturing method of the AMOLED device according to the present invention.
Figure 5:
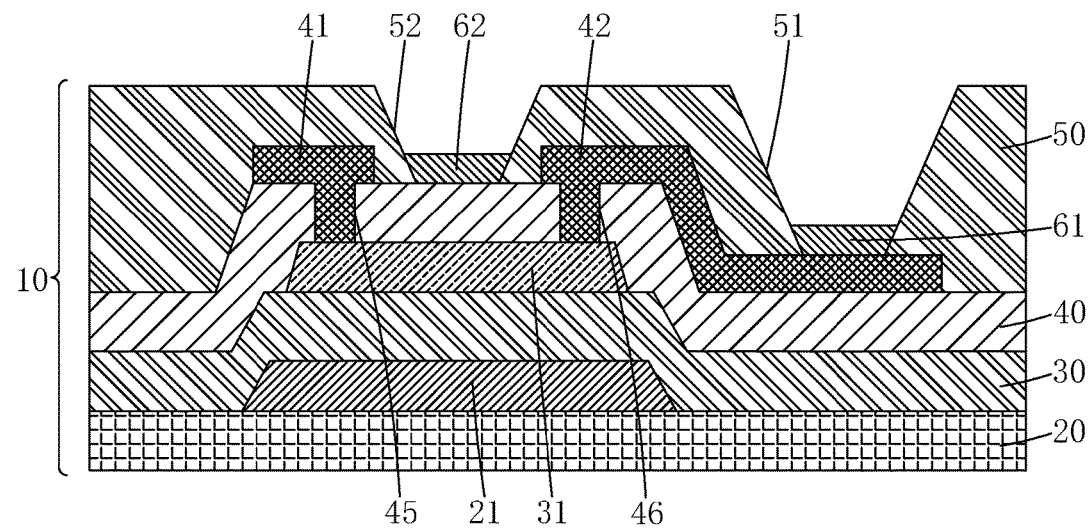

Step 2: as shown in FIGS. 4-5, applying an ink jet printing operation to form an anode 61 in the first via 51 of the planarization layer 50 of the TFT substrate 10 such that the anode 61 is in contact engagement with the drain electrode 42.

Preferably, the ink jet printing operation applied in Step 2 uses a printing substance that comprises an aqueous solution containing nanometer metal particles dispersed therein.

Preferably, the nanometer metal particles comprise at least one of nanometer silver particles, nanometer gold particles, and nanometer copper particles.

Preferably, under a condition that the planarization layer 50 is provided with the second via 52, Step 2 further comprises: applying an ink jet printing operation to form a conductive layer 62 in the second via 52 of the planarization layer 50 of the TFT substrate 10 at the same time of formation of the anode 61.

Specifically, the conductive layer 62 may serve as a channel shielding layer to prevent external light from irradiating a channel zone of the active layer 31 and thus preventing electrical properties of a TFT from being affected; or alternatively, the conductive layer 62 may function as a top gate electrode, providing a TFT with a dual gate structure.

Figure 6:
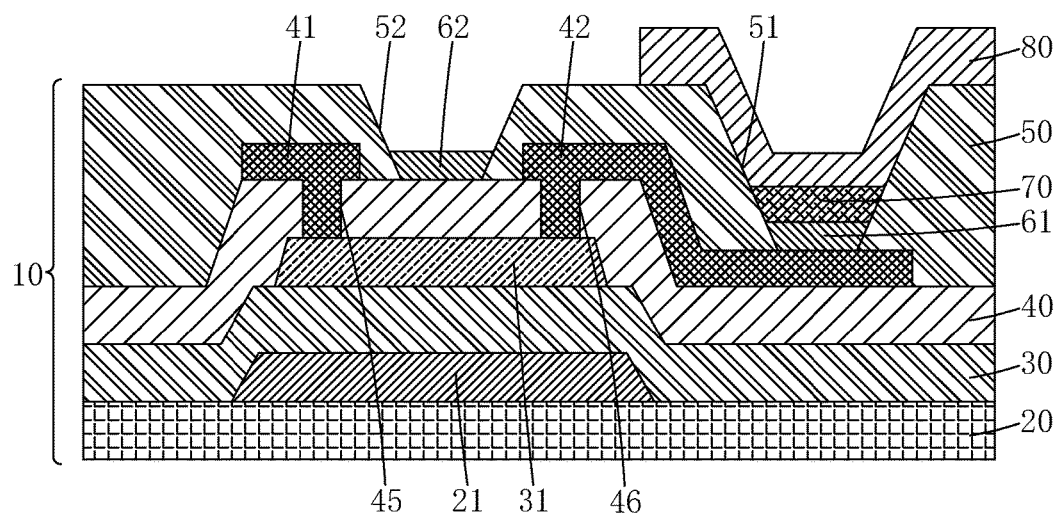
FIG. 6 is a schematic view illustrating Step 3 of the manufacturing method of the AMOLED device according to the present invention and is also a schematic view illustrating the structure of an AMOLED device according to the present invention.

Step 3: as shown in FIG. 6, forming an emissive layer 70 on the anode 61 and forming a cathode 80 on the emissive layer 70 and the planarization layer 50.

To this point, the manufacture of the AMOLED device is completed.

The above-described manufacturing method of the AMOLED device adopts an ink jet printing operation to form an anode of the AMOLED device and thus, compared to the prior art operations, saves one mask and reduces one round of photoengraving thereby simplifying the manufacturing operation of the AMOLED device and lowering the manufacturing costs.

Referring to FIG. 6, based on the above manufacturing method, the present invention also provides an AMOLED device, which comprises: a backing 20, a gate electrode 21 arranged on the backing 20, a gate insulation layer 30 arranged on the gate electrode 21 and the backing 20, an active layer 31 arranged on the gate insulation layer 30 and located above and corresponding to the gate electrode 21, an etch stop layer 40 arranged on the active layer 31 and the gate insulation layer 30, a source electrode 41 and a drain electrode 42 arranged on the etch stop layer 40, a planarization layer 50 arranged on the source electrode 41, the drain electrode 42, and the etch stop layer 40, a first via 51 formed in the planarization layer 50 and located above and corresponding to the drain electrode 42, an anode 61 arranged on the first via 51 and in contact engagement with the drain electrode 42, an emissive layer 70 arranged on the anode 61, and a cathode 80 arranged on the emissive layer 70 and the planarization layer 50.

The anode 61 is formed by applying an ink jet printing operation and the anode 61 comprises a material that comprises nanometer metal particles.

Specifically, the anode 61 is formed through ink jet printing of an aqueous solution containing nanometer metal particles dispersed therein; and preferably, the nanometer metal particles comprise at least one of nanometer silver particles, nanometer gold particles, and nanometer copper particles.

Preferably, the first via 51 has an inner wall surface that exhibits hydrophilic property, and a portion of the drain electrode 42 that is exposed through the first via 51 has a surface that exhibits hydrophilic property; the planarization layer 50 has a portion around a circumference of the first via 51 and having a surface exhibiting hydrophobic property.

Specifically, the planarization layer 50 may further be provided with a second via 52 formed therein, and the second via 52 is arranged to be located above and corresponding to the active layer 31 so as to expose a portion of the etch stop layer 40; the second via 52 receives a conductive layer 62 arranged therein and the conductive layer 62 and the anode 61 are formed in the same process with the same material.

Preferably, the second via 52 has an inner wall surface that exhibits hydrophilic property and the portion of the etch stop layer 40 that is exposed through the second via 52 has a surface that exhibits hydrophilic property; the planarization layer 50 has a portion around a circumference of the second via 52 and having a surface exhibiting hydrophobic property.

Preferably, the planarization layer 50 demonstrates hydrophobic property on a surface of an entire area thereof except the first via 51 and the second via 52.

Specifically, the conductive layer 62 may serve as a channel shielding layer to prevent external light from irradiating a channel zone of the active layer 31 and thus preventing electrical properties of a TFT from being affected; or alternatively, the conductive layer 62 may function as a top gate electrode, providing a TFT with a dual gate structure.

Specifically, the etch stop layer 40 is provided with a third via 45 and a fourth via 46 formed therein to respectively correspond to two opposite ends of the active layer 31 and the source electrode 41 and the drain electrode 42 are respectively set in contact engagement with the active layer 31 through the third via 45 and the fourth via 46.

In the above-described AMOLED device, the anode is formed through an ink jet printing operation, so that the manufacturing operation is simplified and the manufacturing cost is reduced.

In the above-described AMOLED device and the manufacturing method thereof, besides the anode 61 and the conductive layer 62, the materials of the remaining structural layers are as follows:

the backing 20 comprises a glass plate or a plastic plate;

the gate electrode 21, the source electrode 41 and the drain electrode 42 each comprise a material of metal and, preferably, the metal comprises at least one of molybdenum (Mo), aluminum (Al), copper (Cu), and titanium (Ti);

the gate insulation layer 30 and the etch stop layer 40 each comprise a material comprising at least one of silicon oxide and silicon nitride;

the active layer 31 comprises a material comprising at least one of amorphous silicon, polysilicon, and metal oxide semiconductors;

the planarization layer 50 comprises a material comprising an organic insulation material;

the emissive layer 70 comprises a material comprising an organic emissive material; and the cathode 80 comprises a material comprising at least one of a metal and a conductive metal oxide.

In summary, the present invention provides an AMOLED device and a manufacturing method thereof. The manufacturing method of the AMOLED device according to the present invention adopts an ink jet printing operation to form an anode of the AMOLED device and thus, compared to the prior art operations, saves one mask and reduces one round of photoengraving thereby simplifying the manufacturing operation of the AMOLED device and lowering the manufacturing costs. The AMOLED device according to the present invention comprises an anode that is formed through an ink jet printing operation, so that the manufacturing operation is simplified and the manufacturing cost is reduced.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A manufacturing method of an active matrix organic light-emitting diode (AMOLED) device, comprising the following steps:

Step 1: providing a thin-film transistor (TFT) substrate, wherein the TFT substrate comprises a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, and a first via formed in the planarization layer and located above and corresponding to the drain electrode such that the first via exposes at least a portion of the drain electrode;

Step 2: applying an ink jet printing operation to form an anode in the first via of the planarization layer of the TFT substrate such that the anode is in contact engagement with the drain electrode; and Step 3: forming an emissive layer on the anode and forming a cathode on the emissive layer and the planarization layer;

wherein the ink jet printing operation applied in Step 2 uses a printing substance that comprises an aqueous solution containing nanometer metal particles dispersed therein; and the nanometer metal particles comprise at least one of nanometer silver particle, nanometer gold particle, and nanometer copper particle; and wherein in Step 1, the planarization layer is further provided with a second via formed therein and the second via is arranged to be located above and corresponding to the active layer so as to expose a portion of the etch stop layer; and Step 2 further comprises: applying an ink jet printing operation to form a conductive layer in the second via of the planarization layer of the TFT substrate at the same time of formation of the anode; the conductive layer being a channel shielding layer or a top gate electrode.

2. The manufacturing method of the AMOLED device as claimed in claim 1, wherein the first via has an inner wall surface that exhibits hydrophilic property, and the portion of the drain electrode that is exposed through the first via has a surface that exhibits hydrophilic property; and the planarization layer has a portion around a circumference of the first via and having a surface exhibiting hydrophobic property.

3. The manufacturing method of the AMOLED device as claimed in claim 1, wherein the second via has an inner wall surface that exhibits hydrophilic property and the portion of the etch stop layer that is exposed through the second via has a surface that exhibits hydrophilic property; the planarization layer has a portion around a circumference of the second via and having a surface exhibiting hydrophobic property.

4. AMOLED device as claimed in claim 1, wherein the second via has an inner wall surface that exhibits hydrophilic property and the portion of the etch stop layer that is exposed through the second via has a surface that exhibits hydrophilic property; the planarization layer has a portion around a circumference of the second via and having a surface exhibiting hydrophobic property.

5. An active matrix organic light-emitting diode (AMOLED) device, comprising: a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, a first via formed in the planarization layer and located above and corresponding to the drain electrode, an anode arranged on the first via and in contact engagement with the drain electrode, an emissive layer arranged on the anode, and a cathode arranged on the emissive layer and the planarization layer;
  wherein the anode is formed by applying an ink jet printing operation and the anode comprises a material that comprises nanometer metal particles;
  wherein the anode is formed through ink jet printing of an aqueous solution containing nanometer metal particles dispersed therein; and the nanometer metal particles comprise at least one of nanometer silver particle, nanometer gold particle, and nanometer copper particle;
  wherein the planarization layer is further provided with a second via, and the second via is arranged to be located above and corresponding to the active layer so as to expose a portion of the etch stop layer; the second via receives a conductive layer arranged therein and the conductive layer and the anode are formed in the same process with the same material; and the conductive layer is a channel shielding layer or a top gate electrode.

6. The AMOLED device as claimed in claim 5, wherein the first via has an inner wall surface that exhibits hydrophilic property, and a portion of the drain electrode that is exposed through the first via has a surface that exhibits hydrophilic property; the planarization layer has a portion around a circumference of the first via and having a surface exhibiting hydrophobic property.

7. An active matrix organic light-emitting diode (AMOLED) device, comprising: a backing, a gate electrode arranged on the backing, a gate insulation layer arranged on the gate electrode and the backing, an active layer arranged on the gate insulation layer and located above and corresponding to the gate electrode, an etch stop layer arranged on the active layer and the gate insulation layer, a source electrode and a drain electrode arranged on the etch stop layer, a planarization layer arranged on the source electrode, the drain electrode, and the etch stop layer, a first via formed in the planarization layer and located above and corresponding to the drain electrode, an anode arranged on the first via and in contact engagement with the drain electrode, an emissive layer arranged on the anode, and a cathode arranged on the emissive layer and the planarization layer;
  wherein the anode is formed by applying an ink jet printing operation and the anode comprises a material that comprises nanometer metal particles;
  wherein the anode is formed through ink jet printing of an aqueous solution containing nanometer metal particles dispersed therein; and the nanometer metal particles comprise at least one of nanometer silver particle, nanometer gold particle, and nanometer copper particle;
  wherein the first via has an inner wall surface that exhibits hydrophilic property, and a portion of the drain electrode that is exposed through the first via has a surface that exhibits hydrophilic property; the planarization layer has a portion around a circumference of the first via and having a surface exhibiting hydrophobic property; and
  wherein the planarization layer is further provided with a second via, and the second via is arranged to be located above and corresponding to the active layer so as to expose a portion of the etch stop layer; the second via receives a conductive layer arranged therein and the conductive layer and the anode are formed in the same process with the same material; and the conductive layer is a channel shielding layer or a top gate electrode.

8. The AMOLED device as claimed in claim 7, wherein the second via has an inner wall surface that exhibits hydrophilic property and the portion of the etch stop layer that is exposed through the second via has a surface that exhibits hydrophilic property; the planarization layer has a portion around a circumference of the second via and having a surface exhibiting hydrophobic property.

* * * * *